(12) United States Patent
Chiang

(10) Patent No.: US 9,343,675 B2
(45) Date of Patent: *May 17, 2016

(54) MULTISTATE NONVOLATILE MEMORY ELEMENTS

(71) Applicant: Intermolecular Inc., San Jose, CA (US)

(72) Inventor: Tony P. Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 19 days.

This patent is subject to a terminal disclaimer.

(21) Appl. No.: 14/506,193

(22) Filed: Oct. 3, 2014

(65) Prior Publication Data

US 2015/0053910 A1 Feb. 26, 2015

Related U.S. Application Data

(63) Continuation of application No. 13/331,650, filed on Dec. 20, 2011, now Pat. No. 8,878,151, which is a continuation of application No. 12/179,532, filed on Jul. 24, 2008, now Pat. No. 8,101,937.

(60) Provisional application No. 60/962,027, filed on Jul. 25, 2007.

(51) Int. Cl.
*H01L 45/00* (2006.01)
*G11C 13/00* (2006.01)
*G11C 11/56* (2006.01)

(52) U.S. Cl.
CPC .......... *H01L 45/146* (2013.01); *G11C 11/5685* (2013.01); *G11C 13/0007* (2013.01); *G11C 2213/32* (2013.01); *G11C 2213/72* (2013.01); *G11C 2213/77* (2013.01); *G11C 2213/79* (2013.01)

(58) Field of Classification Search
CPC .................................................. G11C 11/5685
See application file for complete search history.

(56) References Cited

U.S. PATENT DOCUMENTS 8,101,937 B2 * 1/2012 Chiang .............. G11C 11/5685 257/2
8,878,151 B2 * 11/2014 Chiang .............. G11C 11/5685 257/2

* cited by examiner

*Primary Examiner* — Robert Carpenter

(57) ABSTRACT

Multistate nonvolatile memory elements are provided. The multistate nonvolatile memory elements contain multiple layers. Each layer may be based on a different bistable material. The bistable materials may be resistive switching materials such as resistive switching metal oxides. Optional conductor layers and current steering elements may be connected in series with the bistable resistive switching metal oxide layers.

20 Claims, 3 Drawing Sheets

MULTISTATE NONVOLATILE MEMORY ELEMENTS

This application is a Continuation Application of U.S. patent application Ser. No. 13/331,650, filed on Dec. 20, 2011, which is a Continuation Application of U.S. patent application Ser. No. 12/179,532, filed on Jul. 24, 2008 (issued as U.S. Pat. No. 8,101,937), which claims priority to U.S. Provisional Patent Application No. 60/962,027, filed Jul. 25, 2007, each of which are hereby incorporated by reference herein in their entirety for all purposes.

BACKGROUND

This invention relates to nonvolatile memory elements, and more particularly, to multistate nonvolatile memory elements.

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly small dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Higher memory densities enable greater storage capabilities with smaller form factors. Traditionally this is achieved by shrinking device dimensions (e.g. memory cell size), stacking memory arrays vertically on a single chip, stacking memory chips in integrated packages, and combinations thereof. However, the above methods may introduce additional cost and complexity. It would therefore be desirable to further increase the densities of nonvolatile memories without relying solely on physical scaling and/or stacking alone.

SUMMARY

In accordance with the present invention, multistable nonvolatile memory elements are provided. The multistable nonvolatile memory elements may be provided in an array on an integrated circuit such as a memory device.

The nonvolatile memory elements may contain multiple bistable layers. The bistable layers may be formed of resistive switching materials such as metal oxides. Current steering elements and conductive layers may be connected in series with the bistable resistive switching layers.

Each resistive switching layer may have an associated high resistance state and an associated low resistance state. The state of each resistive switching layer may be controlled by application of suitable control voltages. For example, a resistive switching layer may be moved from its high resistance state into its low resistance state by application of a set voltage. Once in its high resistance state, a reset voltage may be applied to restore the resistive switching layer to its low resistance state. The reset voltage may have the same polarity as the set voltage or may have an opposite polarity (i.e., in a bipolar arrangement, the reset voltage may be negative while the set voltage is positive).

Each resistive switching layer preferably has a different associated set voltage. The current versus voltage characteristics of each of the resistive switching layers are also staggered in a way that facilitates switching. In a nonvolatile memory device with two bistable resistive switching layers, for example, the resistance of a first of the two layers when in its high resistance state is higher than the resistance of a second of the two layers when in its high resistance state. Additionally, the resistance of the first layer in its low resistance state and the resistance of the second layer in its low resistance state are both lower than either the resistance of the first layer in its high resistance state or the resistance of the second layer in its high resistance state.

Nonvolatile memory elements may have any suitable number of resistive switching layers. If a memory element has n resistive switching layer, where n is a positive integer, the memory element may exhibit n+1 stable states.

Further features of the invention, its nature and various advantages will be more apparent from the accompanying drawings and the following detailed description.

DETAILED DESCRIPTION

The present invention relates to nonvolatile memory elements having multiple stable states. The nonvolatile memory elements may be formed of any suitable layers of multistable material. In accordance with an illustrative embodiment of the present invention, which is described herein as an example, multistable nonvolatile memory elements are formed from multiple layers of resistive switching material. The resistive switching layers may be, for example, bistable layers of metal oxide.

Nonvolatile memory elements in accordance with the invention may be formed on any suitable type of integrated circuit. Most typically, memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of nonvolatile memory elements to form memory arrays on memory devices is merely illustrative. In general, any suitable integrated circuit may be formed using the memory element structures of the present invention. Memory arrays formed from nonvolatile memory elements are described herein as an example.

Figure 1:
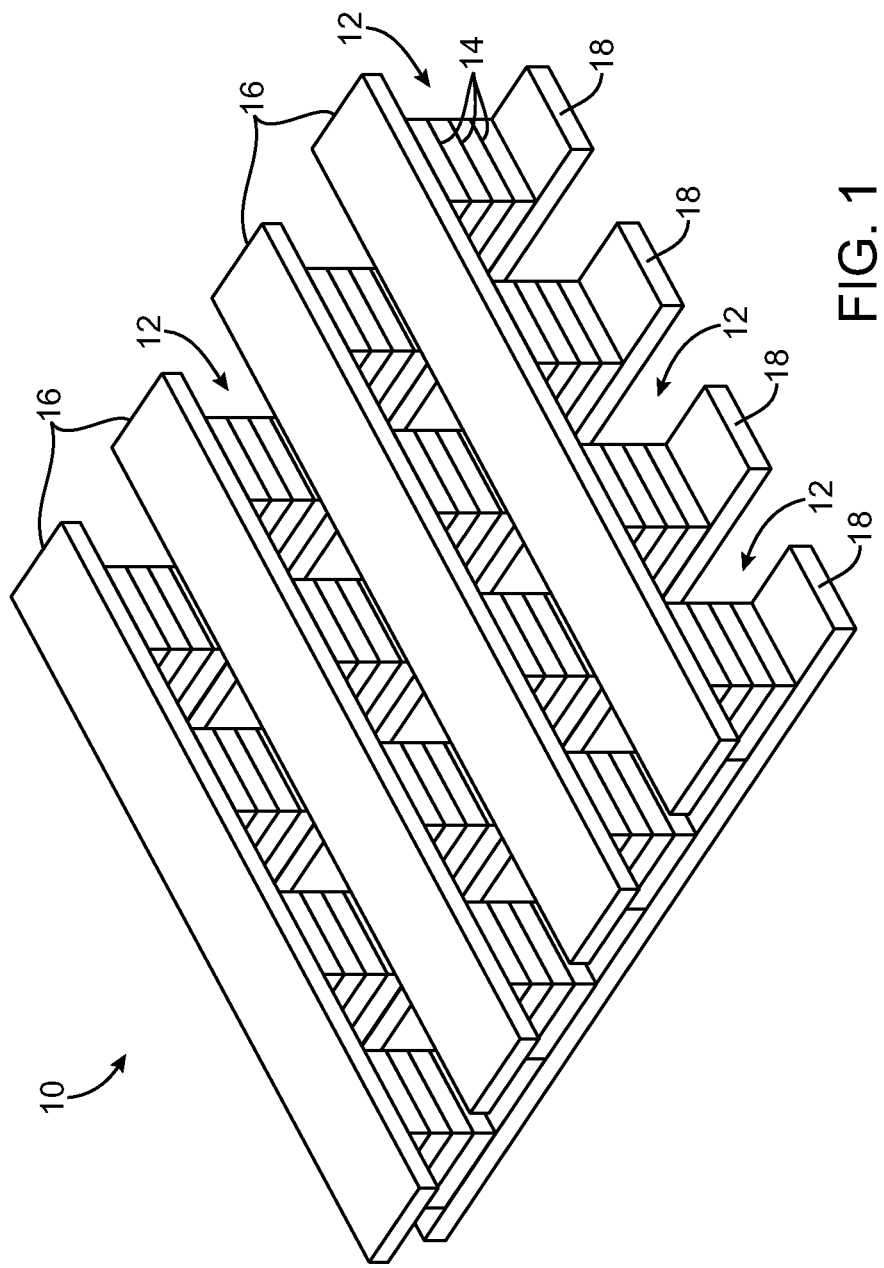
FIG. 1 is a diagram of an illustrative array of multistate nonvolatile memory elements in accordance with an embodiment of the present invention.

An illustrative memory array 10 of nonvolatile memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18.

Memory elements 12 may be formed from one or more layers of materials, as indicated schematically by lines 14 in FIG. 1. In addition, memory arrays such as memory array 10 can be stacked in a vertical fashion to make multilayer memory array structures.

During a read operation, the state of a memory element 12 can be sensed by applying a sensing voltage to an appropriate set of conductors 16 and 18. The resistance of the memory element at the sensing voltage can be determined by measuring the amount of current that flows through the memory element when the sensing voltage is applied.

Depending on its history, a memory element that is addressed in this way may be in one of multiple different states. The number of stable states that a particular memory element supports generally depends on the number of resistive switching layers that the memory element contains. For example, a memory element that contains a single bistable resistive switching layer may exhibit two stable states, whereas a memory element that contains two bistable resistive switching layers may exhibit three stable states. Similarly, a memory element that contains n bistable resistive switching layers, may exhibit n+1 stable states. The value of n may be any positive integer (e.g., two, three, four, five, etc.).

As an example, consider a memory element that contains a single bistable resistive switching layer. Memory elements of this type may be in either a high resistance state or a low resistance state. If the memory element has a high resistance, the memory element may be said to contain a logic one (i.e., a "1" bit). If, on the other hand, the memory element has a low resistance, the memory element may be said to contain a logic zero (i.e., a "0" bit). During a write operation, the state of the memory element can be changed by application of suitable write signals to an appropriate set of conductors 16 and 18.

The voltage that is used to change a memory element from its high resistance state to its low resistance state is generally referred to as the memory element's set voltage. When a voltage equal to the set voltage is applied to the memory element, the memory element transitions from its high resistance state to its low resistance state. A read voltage may be applied to the memory element to detect its resistance state (high or low).

The voltage that is used to change a memory element back to its high resistance state from its low resistance state is generally referred to as its reset voltage. When a memory element is in its low resistance state and a voltage equal to the reset voltage is applied, the memory element will transition to its high resistance state.

Multistate nonvolatile memory elements in accordance with the invention preferably contain two or more bistable layers connected in series. As an example, consider a memory element that contains two bistable resistive switching layers connected in series. Each of the resistive switching layers may be formed from a different material (e.g., materials with different compositions, materials fabricated using different fabrication techniques, materials with different dopings, materials with different crystallinities, materials with different thicknesses, etc.), so that each of the resistive switching layers may have a different corresponding set voltage. In this situation, the memory element may exhibit three stable states (e.g., when both resistive switching layers are in their reset or high resistance state, when one of the resistive switching layers has been set and is in its low resistance state, and when both of the resistive switching layers have been set and are in their low resistance states).

A memory element may also have three bistable resistive switching layers connected in series, each having a different respective set voltage. A memory element of this type may exhibit four stable states.

Memory elements with more than three bistable resistive switching layers connected in series may also be formed. In general, a memory element with n bistable layers will exhibit n+1 stable states.

As these examples demonstrate, providing memory elements with additional layers of bistable resistive switching material allows the memory elements to exhibit additional stable states. This increases the information storing capacity of each individual memory element, without significantly increasing the area occupied by the memory element. A bistable element may store one bit (e.g., 1 or 0), whereas a multistable memory element with four stable states may store two bits. The additional stable states that are available in multistate memories with two or more bistable layers i) allow memory arrays such as memory array 10 of FIG. 1 to exhibit high capacities and ii) reduce the number of stacked memory arrays 10 necessary to achieve the equivalent density.

Figure 2:
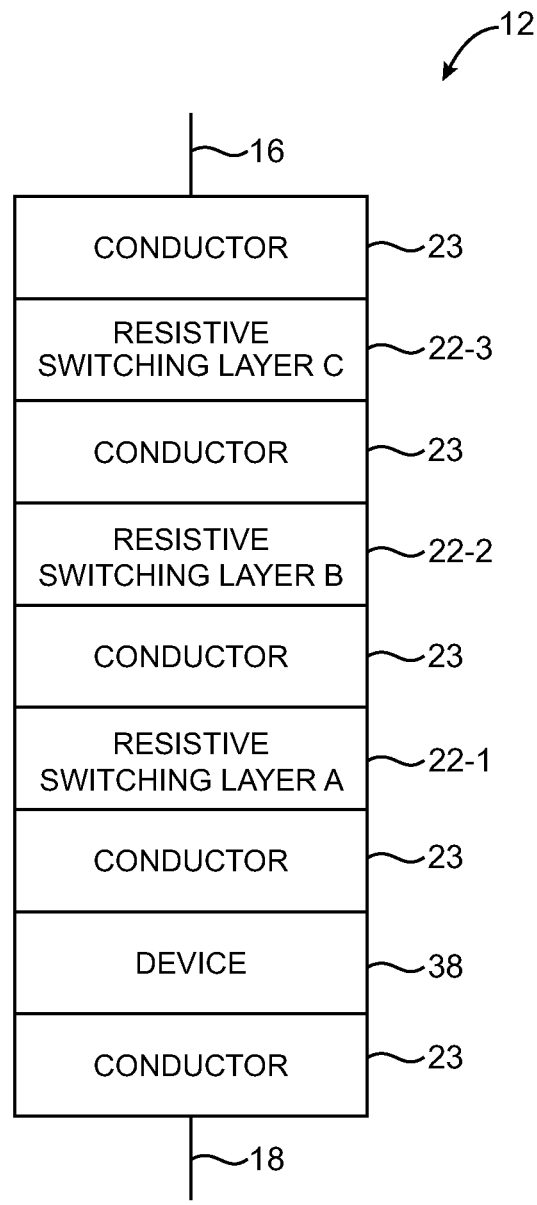
FIG. 2 is a cross-sectional view of an illustrative resistive multistate nonvolatile memory element in accordance with an embodiment of the present invention.

A cross-section of an illustrative embodiment of a resistive switching memory element is shown in FIG. 2. In the example of FIG. 2, memory element 12 is formed from three resistive switching layers 22-1, 22-2, and 22-3 that are connected in series between lines 16 and 18. Resistive switching layers such as 22-1, 22-2, and 22-3 preferably each have a different respective associated set voltage, so that the state of each of the resistive switching layers can be controlled independently. The resistive switching layers may be arranged in any suitable order.

Any suitable materials may be used to form the resistive switching layers in memory element 12. With one suitable arrangement, which is described herein as an example, the resistive switching layers may be formed from metal oxides. For example, resistive switching layer 22-1 may be formed from titanium oxide, resistive switching layer 22-2 may be formed from doped nickel oxide, and resistive switching layer 22-3 may be formed from nickel oxide. Other suitable materials that may be used, in any combination, for resistive switching layers in device 12 include doped titanium oxide, aluminum oxide, doped aluminum oxide, niobium oxide, doped niobium oxide, hafnium oxide, doped hafnium oxide, or other transition metals oxides such as cobalt oxide, doped cobalt oxide, copper oxide, doped copper oxide, zirconium oxide, doped zirconium oxide, vanadium oxide, doped vanadium oxide, tantalum oxide, doped tantalum oxide, zirconium oxide, doped zirconium oxide, cobalt oxide, doped cobalt oxide, copper oxide, doped copper oxide, vanadium oxide, doped vanadium oxide, tantalum oxide, doped tantalum oxide, chromium oxide, doped chromium oxide, molybdenum oxide, doped molybdenum oxide, tungsten oxide, doped tungsten oxide, manganese oxide, and doped manganese oxide. Other resistive-switching materials may also be used.

Examples of dopants that may be incorporated into metal oxide resistive switching layers include Al, Ti, Co, Zr, V, and Nb. Appropriate dopants for each resistive switching layer may be selected based on the base metal oxide that is used for the resistive switching layer.

As shown in FIG. 2, one or more layers of conductor 23 may be optionally connected in series with the series-connected resistive switching layers. If desired, there may be a layer of conductor adjacent to each resistive switching layer, there may be layers of conductor only at the topmost and bottommost positions of the resistive layer stack, there may be a layer of conductor only at the top or only at the bottom of the stack, or there may be any other suitable number of layers of conductor 23 in device 12.

The conductive layers 23 and conductive lines 16 and 18 may be formed from any suitable materials. For example, conductive layers 23 and lines 16 and 18 may be formed from metals such as refractory or transition metals, metal alloys, metal nitrides (e.g., refractory metal nitrides, $Ti_{1-x}Al_xN_y$, $Ta_{1-x}Al_xN_y$, $W_{1-x}Al_xN_y$, $Mo_{1-x}Al_xN_y$, etc.), metal silicon nitrides (i.e., materials containing refractory metals, transition metals, or other metals, along with silicon and nitrogen), metal silicides, doped semiconductors, or other conductors. In one embodiment, conductive lines 16 and 18 may be formed from Al, W, or Cu based interconnects. Other intermediate layers having various functions may also be included. For example, interfacial layers may be included between the resistive switching material 22 and the conductor 23 to modify the work function and/or adhesion properties of the conductor 23.

Conductors 23 are sometimes referred to as electrodes. If desired, conductive line 16 and conductive line 18 may serve as both conductive lines and as electrodes. In this type of arrangement, line 16 may serve as an upper electrode, so that no separate conductor 23 is needed to form an upper electrode for element 12. Similarly, line 18 may serve as a lower electrode, so that no separate conductor is needed to form a lower electrode of element 12.

If desired, one or more optional electrical components may be connected in series with memory element 12. These components, which are sometimes referred to as current steering elements, may include, for example, diodes, p-i-n diodes, silicon diodes, silicon p-i-n diodes, transistors, etc. In the illustrative diagram of FIG. 2, one such current steering element 38 is connected in series with the resistive switching layers 22-1, 22-2, and 22-3 in the lower portion of device 12. This is merely an illustrative arrangement. There may be two or more current steering elements connected in series with the other components of device 12. The current steering elements may be connected in series to the outermost resistive layers (e.g. either resistive switching layer C or resistive switching layer A as shown in FIG. 2) so as to not be interspersed between the resistive switching layers.

The layers of material in device 12 may have any suitable thickness (e.g., 5-5000 angstroms) and may be deposited using any suitable fabrication technique (e.g., physical or chemical vapor deposition, electrochemical deposition, electroless deposition, ion implantation, etc.).

The resistive switching layers such as layers 22-1, 22-2, and 22-3 each exhibit a bistable resistance. When a layer is in its high resistance (resistive) state, it exhibits a relatively high resistance. When a layer is in its low resistance (resistive) state, it exhibits a lower resistance.

Figure 3:
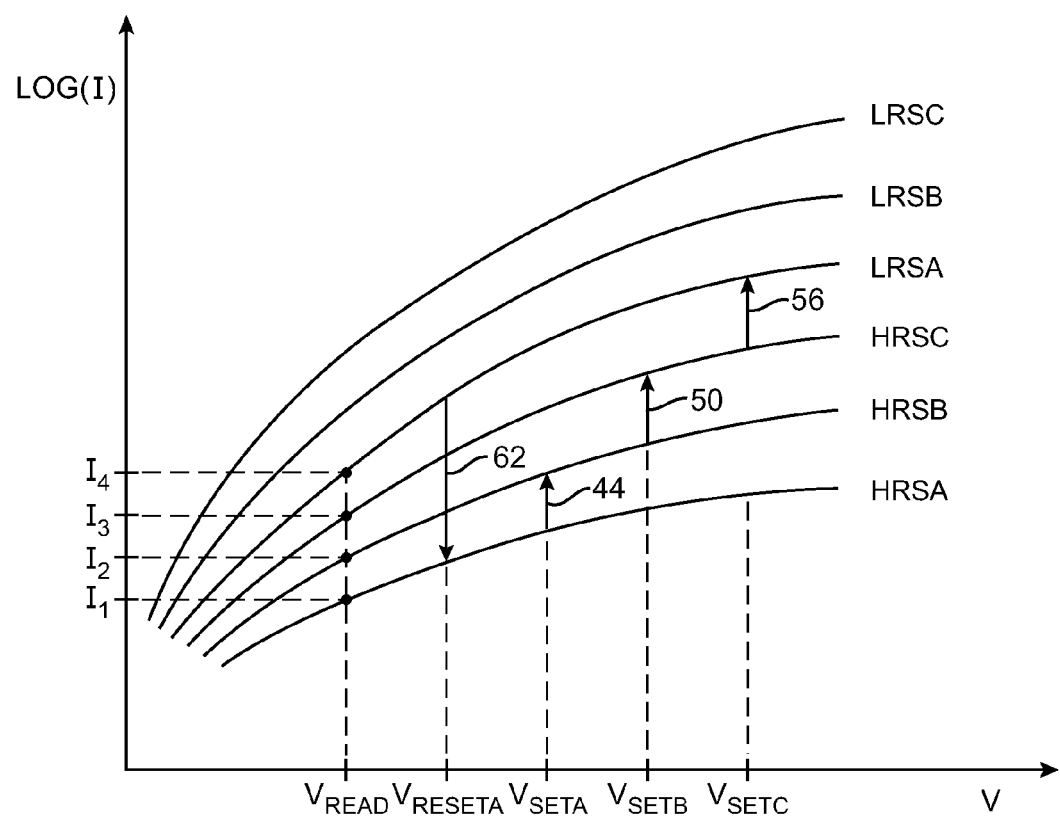
FIG. 3 is a graph showing how a multistate nonvolatile memory element of the type shown in FIG. 2 may exhibit multistable behavior in accordance with an embodiment of the present invention.

An illustrative current (I) versus voltage (V) plot for a device 12 of the type shown in FIG. 2 that has three bistable resistive switching layers is shown in FIG. 3. There are three different bistable resistive switching layers 22-1, 22-2, and 22-3 in device 12, so there are three corresponding pairs of current versus voltage characteristics. The high resistance state of resistive switching layer 22-1 is depicted by line HRSA. The low resistance state of resistive switching layer 22-1 is depicted by line LRSA. The high resistance state of resistive switching layer 22-2 is depicted by line HRSB. The low resistance state of resistive switching layer 22-2 is depicted by line LRSB. The high resistance state of resistive switching layer 22-3 is depicted by line HRSC. The low resistance state of resistive switching layer 22-3 is depicted by line LRSC.

The current versus voltage characteristics of FIG. 3 represents the currents that would flow through each layer as a function of applied voltage if measured individually. These characteristic curves are plotted together in the graph of FIG. 3 to show the relationships between the curves.

The resistance of device 12 is determined by the sum of the resistances of each resistive switching layer. In some preferred embodiments, however, because the resistances of the layers differ significantly (e.g., by an order of magnitude), the resistances of the lower resistance resistive switching layers can be neglected when determining the total resistance of the device 12. For example, as shown in FIG. 3, the resistance of HRSA is greater than the resistance of HRSB, which is greater than the resistance of HRSC, which is further is greater than the resistance of LRSA, and so on. When the layer 22-1 is in its high resistance state, the total resistance of device 12 appears to be approximately HRSA, since the resistance of HRSA is an order of magnitude greater than the resistance of HRSB. When the layer 22-1 switches to its low resistance state LRSA, the output of the device 12 then appears to have a resistance of HRSB, and so on. In some embodiments, the resistance of every high resistance state is greater than the resistance of every low resistance state, so the lowest high resistance state (e.g., HRSC) has a greater resistance than the highest low resistance state (e.g., LRSA). As a result, in any given stable state of device 12, the series resistance of device 12 will be substantially equal to the resistance of the most resistive resistive switching layer.

The states of the resistive switching layers can be controlled by application of suitable voltages across device 12 (i.e., between lines 16 and 18). Initially, device 12 may be in a state in which all resistive switching layers including resistive switching layer 22-1 are in their high resistance states. In this case, the series resistance of device 12 will be determined by the shape of line HRSA. When a read voltage $V_{READ}$ is applied to device 12, the measured current will be $I_1$, indicating that device 12 is in its first stable state (i.e., its highest resistance state).

To place device 12 in its second stable state, a voltage of $V_{SETA}$ may be applied to device 12, where $V_{SETA}$ represents the set voltage for resistive switching layer 22-1. When the voltage $V_{SETA}$ is applied to device 12, most of the voltage drop in device 12 appears across its most resistive layer (i.e., resistive switching layer 22-1). As a result, the voltage across layer 22-1 is substantially equal to $V_{SETA}$. This causes layer 22-1 to transition from its high resistance state (line HRSA) to its low resistance state (line LRSA).

When layer 22-1 transitions to its low resistance state, layer 22-1 is no longer the most resistive layer in device 12. Rather, layer 22-2, which is in its high resistance state, becomes the most resistive layer. Accordingly, application of voltage $V_{SETA}$ causes the output of device 12 to transition from line HRSA to line HRSB, as shown by line 44 in FIG. 3. At this stage, device 12 is in its second stable state. The state of device 12 may be sensed by applying voltage $V_{READ}$ to device 12 and measuring the resulting current ($I_2$).

In a similar fashion, device 12 may be placed in its third and fourth stable states.

To place device 12 in its third stable state, a voltage of $V_{SETB}$ is applied. In this situation, most of the voltage drop in device 12 appears across layer 22-2 as the resistance of layer 22-2 dominates device 12. This causes layer 22-2 to transition from its high resistance state to its low resistance state and causes the output of device 12 to move from line HRSB to line HRSC, as indicated by line 50. The third stable state of device 12 may be sensed by applying read voltage $V_{READ}$ and measuring the resulting current ($I_3$).

Device 12 is placed in its fourth stable state when the voltage $V_{SETC}$ is applied. This causes the third resistive switching layer 22-3 to transition from its high resistance state to its low resistance state. As indicated by line 56, the output of device 12 transitions from the line HRSC, where the output of device 12 is dominated by the resistance of layer 22-3 in its high resistance state to the line LRSA, where the output of device 12 is dominated by the most resistive of the three low resistance states—the low resistance state associated with resistive switching layer 22-1 (line LRSA). When placed in its fourth stable state in this way, device 12 will exhibit a current of $I_4$ when the read voltage $V_{READ}$ is applied. The magnitude of the set and reset voltages may vary, but preferably there is at least greater than or equal to 0.5V separation between the values.

To reset device 12 to its first stable state from its fourth stable state, the voltage $V_{RESETA}$ (corresponding to the reset voltage of resistive switching layer 22-1) is applied across device 12. As shown by line 62 in FIG. 3, this causes the output of device 12 to transition from line LRSA to line HRSA. Following reset operations, device 12 is in its first stable state. If sense voltage $V_{READ}$ is applied to device 12, the resulting current will be $I_1$.

Although the example of FIGS. 2 and 3 involves three resistive switching layers, device 12 may have any suitable number of layers (e.g., two, three, four, five, more than five, etc.). Moreover, it is not necessary for the low and high resistance states for the layers to be ordered as shown in FIG. 3. As one example, the positions of the LRSB curve and the LRSC curve may be reversed.

In another embodiment, if the resistance of LRSB is greater than LRSA, for example, the device 12 exhibits three (or n) output states. For example, in this embodiment, when the device 12 receives $V_{SETC}$, it transitions from HRSC to LRSB. A $V_{RESETA}$ pulse is then applied to the device 12 to return the output of the device to approximately the line HRSB. The device 12, with the resistance of LRSB greater than the resistance of LRSA may then transition between HRSB, HRSC, and LRSB, for three states.

Although multistable switching has been illustrated in scenarios involving positive reset voltages, the reset voltages need not, in general, have the same polarity as the set voltages. When $V_{SET}$ is positive, for example, $V_{RESET}$ may be either positive or negative. A situation in which both $V_{SET}$ and $V_{RESET}$ are positive is illustrated in the example of FIG. 2. In bipolar arrangements, $V_{RESET}$ and $V_{SET}$ may have opposite polarities (i.e., $V_{RESET}$ may be negative, whereas $V_{SET}$ may be positive).

The foregoing is merely illustrative of the principles of this invention and various modifications can be made by those skilled in the art without departing from the scope and spirit of the invention.

What is claimed is:

1. A device comprising:
    a first resistive switching layer comprising a first metal oxide,
        wherein the first resistive switching layer is operable to switch at a first set voltage;
    a second resistive switching layer connected in series with the first resistive switching layer within the device,
        wherein the second resistive layer comprises a second metal oxide,
        wherein a composition of the second resistive layer is different from a composition of the first resistive layer,
        wherein the second resistive switching layer is operable to switch at a second set voltage different from the first set voltage; and
    a third resistive switching layer connected in series with the first resistive switching layer and with the second resistive switching layer within the device,
        wherein the third resistive layer comprises a third metal oxide,
        wherein a composition of the third resistive layer is different from the composition of the second resistive layer and from the composition of the first resistive switching layer,
        wherein the third resistive switching layer is operable to switch at a third set voltage different from the first set voltage and different from the second set voltage.

2. The device of claim 1, wherein the first metal oxide is one of titanium oxide, aluminum oxide, niobium oxide, hafnium oxide, cobalt oxide, copper oxide, zirconium oxide, vanadium oxide, tantalum oxide, chromium oxide, molybdenum oxide, tungsten oxide, or manganese oxide,
    wherein the second metal oxide is one of titanium oxide, aluminum oxide, niobium oxide, hafnium oxide, cobalt oxide, copper oxide, zirconium oxide, vanadium oxide, tantalum oxide, chromium oxide, molybdenum oxide, tungsten oxide, or manganese oxide, and
    wherein the third metal oxide is one of titanium oxide, aluminum oxide, niobium oxide, hafnium oxide, cobalt oxide, copper oxide, zirconium oxide, vanadium oxide, tantalum oxide, chromium oxide, molybdenum oxide, tungsten oxide, or manganese oxide.

3. The device of claim 1, wherein the first metal oxide is different from the second metal oxide and different from the third metal oxide.

4. The device of claim 3, wherein the second metal oxide and the third metal oxide are the same.

5. The device of claim 4, wherein the second resistive switching layer further comprises a dopant, wherein the dopant is one of aluminum, titanium, cobalt, zirconium, vanadium, or niobium.

6. The device of claim 1, wherein the first metal oxide is titanium oxide, wherein the second metal oxide is nickel oxide, wherein the third metal oxide is nickel oxide, and wherein the second resistive switching layer further comprises a dopant.

7. The device of claim 1, wherein the first resistive switching layer, the second resistive switching layer, and the third resistive switching layer form a stack such that the second resistive switching layer is disposed between the first resistive switching layer and the third resistive switching layer.

8. The device of claim 7, further comprising a first conductive layer and a second conductive layer, wherein the first conductive layer is disposed between the first resistive switching layer and the second resistive switching layer, and wherein the second conductive layer is disposed between the second resistive switching layer and the third resistive switching layer.

9. The device of claim 8, wherein one of the first conductive layer or the second conductive layer comprises a metal nitride, a metal silicon nitride, a metal silicide, or a doped semiconductor.

10. The device of claim 1, further comprising a current steering element connected in series with the first resistive switching layer, the second resistive switching layer, and the third resistive switching layer within the device.

11. The device of claim 10, wherein the current steering element comprises one of a diode, a p-i-n diode, a silicon diode, a silicon p-i-n diode, or a transistor.

12. The device of claim 1, wherein the device is operable to switching between at least four different resistive states.

13. The device of claim 1,
wherein the first resistive switching layer has a first low resistive state and a first high resistive state,
wherein the second resistive switching layer has a second low resistive state and a second high resistive state,
wherein the third resistive switching layer has a third low resistive state and a third high resistive state,
wherein the first resistive switching layer switches from the first high resistive state to the first low resistive state when the first set voltage is applied to the device,
wherein the second resistive switching layer switches from the second high resistive state to the second low resistive state when the second set voltage is applied to the device; and
wherein the third resistive switching layer switches from the third high resistive state to the third low resistive state when the third set voltage is applied to the device.

14. The device of claim 13,
wherein a resistance of the first resistive switching layer in the first high resistive state is greater than a resistance of the second resistive switching layer in the second high resistive state, and
wherein a resistance of the first resistive switching layer in the first low resistive state is greater than a resistance of the second resistive switching layer in the second low resistive state.

15. The device of claim 13,
wherein a resistance of the third resistive switching layer in the third high resistance state is greater than a resistance of the first resistive switching layer in the first low resistive state,
wherein the resistance of the third resistive switching layer in the third high resistance state is greater than a resistance of the second resistive switching layer the second low resistive state, and
wherein the resistance of the third resistive switching layer in the third high resistance state is greater than the resistance of the third resistive switching layer in the third low resistive state.

16. The device of claim 15,
wherein the resistance of the first resistive switching layer in the first high resistive state is greater than the resistance of the second resistive switching layer in the second high resistive state,
wherein the resistance of the second resistive switching layer in the second high resistive state is greater than the resistance of the third resistive switching layer in the third high resistive state,
wherein the resistance of the first resistive switching layer in the first low resistive state is greater than the resistance of the second resistive switching layer in the second low resistive state, and
wherein the resistance of the first resistive switching layer in the first low resistive state is greater than the resistance of the third resistive switching layer in the third low resistive state.

17. The device of claim 15,
wherein the resistance of the first resistive switching layer in the first high resistive state is greater than the resistance of the second resistive switching layer in the second high resistive state,
wherein the resistance of the second resistive switching layer in the second high resistive state is greater than the resistance of the third resistive switching layer in the third high resistive state, and
wherein the resistance of the second resistive switching layer in the second low resistive state is greater than the resistance of the third resistive switching layer in the third low resistive state.

18. The device of claim 1, further comprising a first electrode and a second electrode, wherein the first resistive switching layer, the second resistive switching layer, and the third resistive switching layer are disposed between the first electrode and the second electrode.

19. The device of claim 18, wherein the first electrode and the second electrode each interface other devices within an array comprising the device.

20. The device of claim 18, wherein the first electrode directly interfaces the first resistive switching layer.

* * * * *